(12) United States Patent
Nitta et al.

(10) Patent No.: US 7,776,200 B2
(45) Date of Patent: Aug. 17, 2010

(54) STRUCTURE AND METHOD OF MANUFACTURING THE SAME

(75) Inventors: Koji Nitta, Osaka (JP); Kenji Miyazaki, Osaka (JP); Shinji Inazawa, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 208 days.

(21) Appl. No.: 12/219,573

(22) Filed: Jul. 24, 2008

(65) Prior Publication Data

US 2008/0296163 A1 Dec. 4, 2008

Related U.S. Application Data

(62) Division of application No. 10/586,923, filed as application No. PCT/JP2005/017590 on Sep. 26, 2005, now Pat. No. 7,611,591.

(30) Foreign Application Priority Data

Nov. 24, 2004 (JP) ............................. 2004-339418

(51) Int. Cl.
*C25D 1/00* (2006.01)
*C22C 27/04* (2006.01)
(52) U.S. Cl. .......................... 205/230; 205/67; 148/423
(58) Field of Classification Search .................. 205/67, 205/87, 230; 148/423
See application file for complete search history.

(56) References Cited

U.S. PATENT DOCUMENTS

| 4,507,151 A | 3/1985 | Simm et al. |
| 5,681,783 A | 10/1997 | Nilsson et al. |

FOREIGN PATENT DOCUMENTS

| DE | 31 52 549 C2 | 1/1985 |
| JP | 7-316817 A | 12/1995 |
| JP | 2003-213484 A | 7/2003 |
| JP | 2004-84059 A | 3/2004 |
| JP | 2004-124129 A | 4/2004 |

OTHER PUBLICATIONS

German Office Action, with English translation, issued in German Patent Application No. 11 2005 000 355.8-45, mailed May 28, 2009.
Hideya Takenishi and Akira Katagiri, "Effect of Oxide Ion on the Electrodeposition of Tengsten in the $ZnCl_2$-NaCl (60-40 mol%) Melt," Electrochemistry, 1999, pp. 669-676, vol. 67, No. 6.

*Primary Examiner*—Roy King
*Assistant Examiner*—Jessee R. Roe
(74) *Attorney, Agent, or Firm*—McDermott Will & Emery LLP

(57) ABSTRACT

A method for manufacturing a structure including tungsten as a main component and tungsten carbide is provided. In the structure, the content of carbon is at least 0.1% by mass and the total content of cobalt, nickel, and iron is 3% or less by mass, respectively based on the structure.

3 Claims, 2 Drawing Sheets

STRUCTURE AND METHOD OF MANUFACTURING THE SAME

RELATED APPLICATIONS

This application is a Divisional of U.S. application Ser. No. 10/586,923, now U.S. Pat. No. 7,611,591, filed Jul. 24, 2006, which is a U.S. National Phase under 35 U.S.C. §371 of International Application No. PCT/JP2005/017590, filed on Sep. 26, 2005, and claims priority of Japanese Application No. 2004-339418, filed on Nov. 24, 2004, the entire contents of each of which are hereby incorporated by reference.

TECHNICAL FIELD

The present invention relates to a structure and a method of manufacturing the structure. More particularly, the invention relates to a structure having high-hardness and a smooth surface, and to a method of manufacturing the structure.

BACKGROUND ART

Tungsten carbide has been used in various structures, such as mechanical parts and metal molds, because of its excellent mechanical characteristics (hardness, strength, toughness, abrasion resistance, and the like). A structure containing tungsten carbide is manufactured, for example, by thermal spraying or sintering. In any of such manufacturing method, a binder metal, such as cobalt, nickel, or iron, is used to bind tungsten carbide crystal grains, since tungsten carbide has a high melting point. However, there have been cases in which such a structure (for example, a micro drill) is broken as a result of a binder metal lump (pool) acting as the origin of fracture of the structure.

Likewise, in a case where tungsten carbide is used for coating a mechanical part, thermal spraying is generally adopted. In such a case, a film (structure) formed on the mechanical part by thermal spraying is porous, and therefore its mechanical strength is low and its corrosion resistance is poor. Furthermore, it is difficult to form a film (structure) having a smooth surface only by thermal spraying. When tungsten carbide is utilized in a micropart having a size on the order of micrometers, such as a micro electro mechanical system (MEMS), or in the coating of a micropart, it is impossible to achieve sufficient precision with such a method as the thermal spraying or sintering. Patent Document 1: Japanese Unexamined Patent Application Publication No. 2004-124129

DISCLOSURE OF INVENTION

Problems to be Solved by the Invention

It is an object of the present invention to provide a structure having high hardness and smooth surface and to provide a method of manufacturing the structure.

Means for Solving Problem

A structure according to the present invention contains tungsten as a main component and tungsten carbide, wherein the carbon content is at least 0.1% by mass of the structure and the total content of cobalt, nickel, and iron is 3% or less by mass of the structure.

Preferably, the structure according to the present invention has a Vickers hardness of at least 800.

Preferably, the structure according to the present invention has a density of at least 10 g/cm$^3$.

Preferably, the structure according to the present invention has a surface roughness of 1 μm or less.

Preferably, the crystal grains of the structure according to the present invention have an average grain size of 50 nm or less.

The structure according to the present invention can be made such that the number of pools having a size of at least 5 μm and consisting of at least one element selected from the group consisting of cobalt, nickel, and iron is not more than one per 100 mm$^2$ of the surface of the structure.

The size of a structure according to the present invention can be on the order of micrometers.

Furthermore, the present invention provides a method of manufacturing any of the structures described above, which method includes a step of forming the structure by electro-deposition in a molten salt bath containing tungsten; zinc; an organic compound; at least two elements selected from the group consisting of lithium, sodium, potassium, rubidium, cesium, beryllium, magnesium, calcium, strontium, and barium; and at least one element selected from the group consisting of fluorine, chlorine, bromine, and iodine.

In the method of manufacturing a structure according to the present invention, the structure is preferably formed by electro-deposition at the temperature of the molten salt of 300° C. or less.

In the method of manufacturing a structure according to the present invention, the organic compound may be polyethylene glycol.

ADVANTAGEOUS EFFECT OF THE INVENTION

According to the present invention, a structure having high-hardness and smooth surface and a method of manufacturing the structure can be provided.

Figure 1:
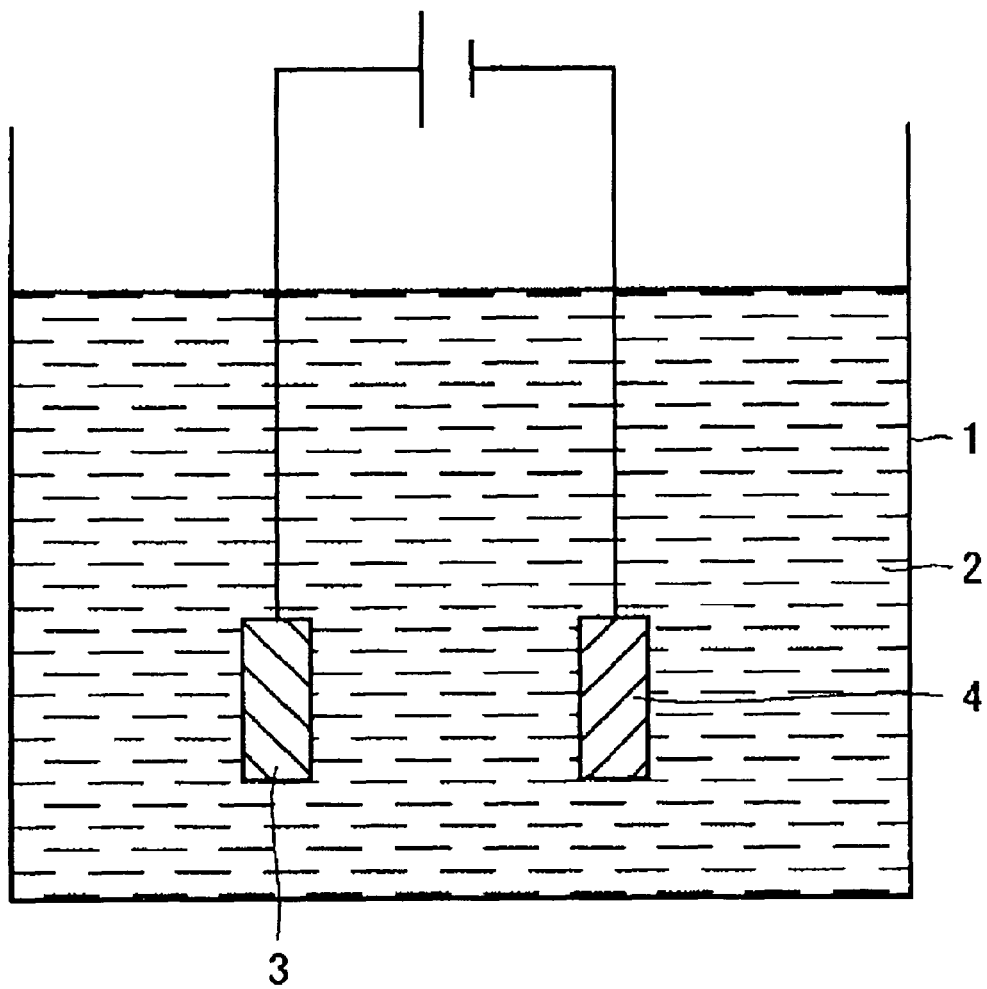
FIG. 1 is a schematic view of an exemplary apparatus for use in the manufacture of a structure according to the present invention.

REFERENCE NUMERALS 1 electrolytic tank
2 molten salt
3 anode
4 cathode
5 structure

BEST MODE FOR CARRYING OUT THE INVENTION

A structure according to the present invention contains tungsten as a main component and tungsten carbide, the carbon content being at least 0.1% by mass of the structure and the total content of cobalt, nickel, and iron being 3% by mass or less of the structure. The phrase "contains as a main component" herein means that the subject constitutes at least 50% by mass of the structure according to the present invention.

The term "the carbon content" herein means the total content of carbon that is chemically bonded to tungsten to form tungsten carbide and elementary carbon that is not chemically bonded to tungsten.

The present inventors found that a novel structure in which tungsten as a main component and tungsten carbide are contained can be manufactured without using a binder metal, such as cobalt, nickel, or iron. The structure according to the present invention is a polycrystal in which fine crystal grains are densely contained, and contains tungsten and tungsten carbide in which tungsten and carbon are chemically bonded together. The structure according to the present invention may contain elementary carbon, which is not chemically bonded to tungsten.

In the conventional methods including thermal spraying and sintering, a binder metal, such as cobalt, nickel, or iron, is essential to bind tungsten carbide crystal grains, which resulted in inevitably allowing the final product to contain at least 5% by mass of the binder metal based on the mass of the structure. In the present invention, however, since a binder metal is unnecessary, the binder metal content of the structure can be reduced to 3% by mass or less, and therefore it is possible to effectively prevent the occurrence of breakage originating from a pool of binder metal.

Preferably, the structure according to the present invention has a Vickers hardness of at least 800. This improves the hardness of the structure according to the present invention. The structure according to the present invention has a dense structure composed of fine crystal grains and can thereby have a Vickers hardness of at least 800.

Preferably, the structure according to the present invention has a density of at least 10 g/cm$^3$. This tends to improve the physical properties, such as hardness and surface smoothness, of the structure according to the present invention. A conventional structure containing tungsten carbide formed by thermal spraying is porous and cannot have a density as high as 10 g/cm$^3$. In contrast, the structure according to the present invention has a dense structure composed of fine crystal grains and can have a density of at least 10 g/cm$^3$.

Preferably, the structure according to the present invention has a surface roughness of 1 μm or less. This tends to improve the surface smoothness of the structure according to the present invention. A conventional structure containing tungsten carbide formed by thermal spraying has poor surface smoothness with a surface roughness of more than 1 μm. In contrast, the structure according to the present invention is a dense polycrystal of fine crystal grains and can have a surface roughness of 1 μm or less. The term "surface roughness" as used in the present invention means an arithmetical mean roughness Ra (JIS B0601-1994).

Preferably, the crystal grains of the structure according to the present invention have an average grain size of 50 nm or less. This tends to make the structure according to the present invention denser and improve physical properties, such as hardness and surface smoothness, of the structure according to the present invention. The term "average grain size" as used herein means the average grain size of a hundred of crystal grains arbitrarily selected, on the basis of the grain size of one crystal grain which is defined by the average of the maximum length and the minimum length of a crystal grain of the structure according to the present invention.

In the structure according to the present invention, the number of pools having a size of at least 5 μm and consisting of at least one binder metal selected from the group consisting of cobalt, nickel, and iron can be limited to one or less per 100 mm$^2$ of the surface of the structure according to the present invention. This tends to reduce the fracture of the structure originating from a pool of the binder metal. In the conventional methods including thermal spraying and sintering, at least one binder metal selected from the group consisting of cobalt, nickel, and iron was required, which resulted in allowing a conventional structure containing tungsten carbide to include, per 100 mm$^2$ of the surface of the structure, at least one pool consisting of the above-mentioned binder metal and having a size of at least 5 μm. In contrast, in the present invention, since the above-mentioned binder metal is not used, the number of pools consisting of the binder metal and having a size of at least 5 μm can be reduced to one or less.

In the present invention, the number of pools of the binder metal is determined as follows. First, a surface of a structure according to the present invention is analyzed by element mapping with an energy dispersive X-ray analyzer (EDX) and is subjected to image processing to identify a region containing at least 80% by mass of at least one binder metal selected from the group consisting of cobalt, nickel, and iron. Second, the average of the maximum length and the minimum length of the region is referred to as a pool size. The number of regions having a pool size of at least 5 μm is counted over the entire surface of the structure. Finally, the number of pools of the binder metal is determined by converting the number of regions thus counted into the number of regions per 100 mm$^2$ of the surface of the structure.

An exemplary method of manufacturing a structure according to the present invention will be described below. First, a molten salt bath is prepared. The molten salt contains at least two elements selected from the group consisting of lithium, sodium, potassium, rubidium, cesium, beryllium, magnesium, calcium, strontium, and barium; at least one element selected from the group consisting of fluorine, chlorine, bromine, and iodine; tungsten; zinc; and an organic compound. This molten salt bath is prepared as follows: at least two halides selected from the group consisting of a halide (fluorine, chlorine, bromine, or iodine) of a predetermined alkali metal (lithium, sodium, potassium, or rubidium) and a halide (fluorine, chlorine, bromine, or iodine) of a predetermined alkali earth metal (beryllium, magnesium, calcium, strontium, or barium), a tungsten compound, such as tungsten chloride, and a zinc compound such as zinc chloride are mixed so as to make a molten salt; and an organic compound, such as polyethylene glycol, is added to the molten salt.

Lithium, sodium, potassium, rubidium, cesium, beryllium, magnesium, calcium, strontium, barium, fluorine, chlorine, bromine, iodine, tungsten, or zinc that can be contained in the molten salt bath may have any form in the molten salt bath and may be an ion or a coordination compound thereof, for example. These elements can be detected, for example, by performing inductively coupled plasma (ICP) emission spectroscopic analysis of a sample of the molten salt bath of the present invention which is dissolved in water. An organic compound contained in the molten salt bath of the present invention can be detected, for example, by performing Fourier transform infrared spectroscopy (FT-IR) of a sample of the molten salt bath dissolved in water.

The molten salt is put in an electrolytic tank 1 illustrated in FIG. 1. Then, an anode 3 and a cathode 4 are dipped into the molten salt 2 in the electrolytic tank 1. An electric current is applied between the anode 3 and the cathode 4 to electrolyze the molten salt 2. This allows a metal contained in the molten salt 2 to be deposited on the surface of the cathode 4.

The molten salt of the present invention allows electrolysis at a temperature as low as 400° C. or less. Thus, even when an electroformed mold that has a fine resist pattern formed, for example, by irradiating a resin, such as polymethyl methacrylate (PMMA), with X rays on an electroconductive substrate is dipped as a cathode, it is possible to substantially prevent the resist pattern from being deformed by high temperature of the molten salt bath. Thus, in this case, the electro-deposition of the structure according to the present invention can be performed at the temperature of the molten salt as low as 400° C. or less. To reduce the decomposition of an organic compound, such as polyethylene glycol, in the molten salt, the molten salt is preferably electrolyzed at a temperature of 300° C. or less.

In the present invention, it is possible to make the structure to have a shape on the order of micrometers, since electrolysis can be performed by the method as described above using an electroformed mold having a fine resist pattern on the order of micrometers as a cathode.

Figure 2A:
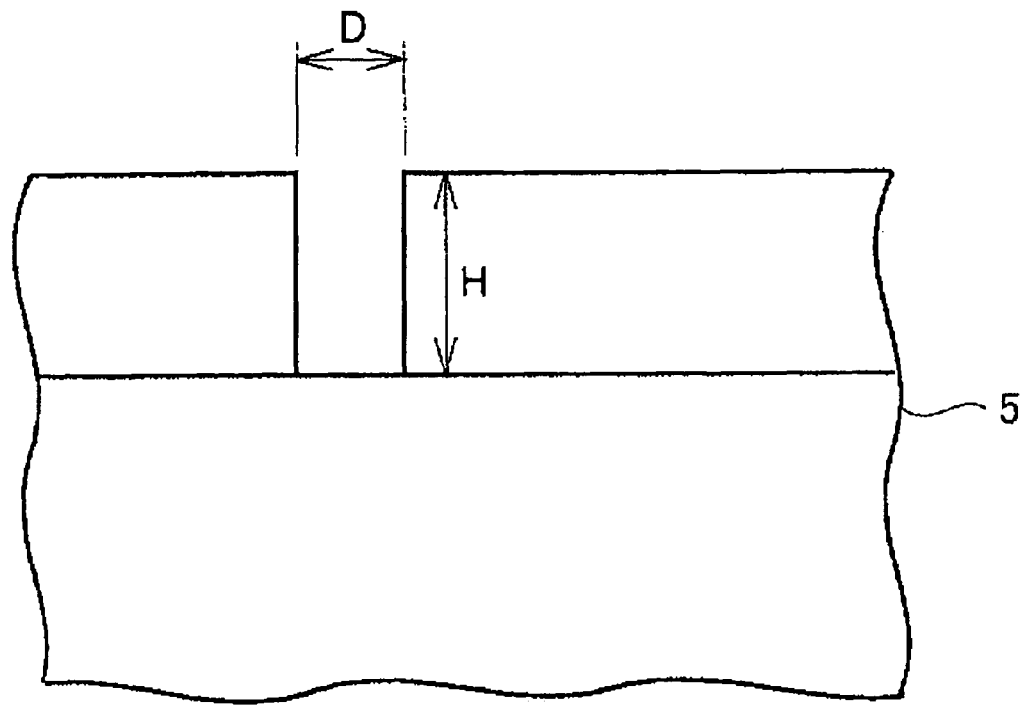
FIG. 2(A) is a schematic cross-sectional view illustrating a structure having a concave shape on the order of micrometers according to the present invention.
Figure 2B:
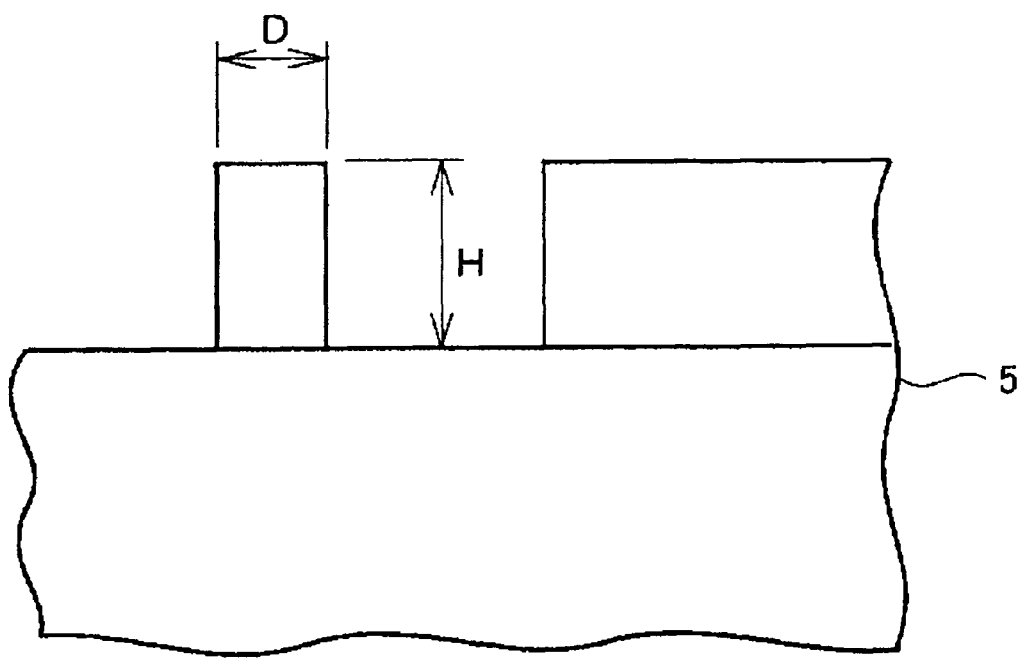
FIG. 2(B) is a schematic cross-sectional view illustrating a structure having a convex shape on the order of micrometers according to the present invention.

The phrase "have a shape on the order of micrometers" herein means that, for example, as illustrated in the schematic cross-sectional views of FIGS. 2(A) and 2(B), at least one width D of a concave portion and/or a convex portion of a structure 5 according to the present invention is 1 μm to 100 μm and that the height of a concave portion and/or a convex portion having a width D of 1 μm to 100 μm is 1 μm to 1000 μm.

The electroconductive substrate may be, for example, a substrate formed of an elementary metal or an alloy, or a substrate formed of a nonelectroconductive base material, such as glass, and an electroconductive metal plated thereon. The structure according to the present invention can be used, for example, in mechanical parts, such as a contact probe, a microconnector, a miniature relay, and various sensor parts, or as a coating film of these mechanical parts. Likewise, the structure according to the present invention can be used, for example, in mechanical parts, such as a variable capacitor, an inductor, a radio frequency micro electro mechanical system (RFMEMS) such as an array or an antenna, a member for an optical MEMS, an ink jet head, an electrode in a biosensor, a member for a power MEMS (electrode, etc.), or as a coating film of these mechanical parts.

EXAMPLES

Example 1

A $ZnCl_2$ (zinc chloride) powder, a NaCl (sodium chloride) powder, a KCl (potassium chloride) powder, and a KF (potassium fluoride) powder were dried respectively in a vacuum oven at 200° C. for 12 hours. A $WCl_4$ (tungsten tetrachloride) powder was dried in a vacuum oven at 100° C. for 12 hours. The $ZnCl_2$ powder, the NaCl powder, and the KCl powder were weighed respectively in a glove box in an Ar (argon) atmosphere so as to be at a ratio of 60:20:20 by mole and the powders thus weighed were charged into an alumina crucible in the same glove box.

The KF powder and the $WCl_4$ powder were weighed in the glove box so as to be 4 mol and 0.54 mol, respectively, per 100 mol of a mixture of the $ZnCl_2$, NaCl, and KCl powders contained in the alumina crucible, and these powders were charged into the alumina crucible.

The alumina crucible containing the $ZnCl_2$, NaCl, KCl, KF, and $WCl_4$ powders were heated in the glove box so as to melt these powders. Thus, 500 g of molten salt was prepared. Subsequently, 0.54 mol (equimolar amount to $WCl_4$) of polyethylene glycol (weight-average molecular weight 2000), which had been dehydrated with a molecular sieve for 24 hours, was added to the molten salt, and thus a molten salt bath was prepared.

A mirror-polished nickel plate having an arithmetical mean roughness Ra (JIS B0601-1994) of less than 10 nm serving as a cathode and a tungsten rod having a diameter of 5 mm serving as an anode were dipped into the molten salt in the glove box. Then, 3 mA electric current per 1 $cm^2$ of the nickel plate (electric current density: 3 $mA/cm^2$) was applied between the electrodes for 10 hours while the temperature of the molten salt was maintained at 250° C. A structure was electro-deposited on the surface of the nickel plate cathode by galvanostatic electrolysis under such conditions.

The nickel plate on which the structure was electro-deposited was removed from the glove box into the air as a structure of EXAMPLE 1. The same procedures as described above were performed several times to prepare a plurality of structures of Example 1.

The structures of Example 1 were evaluated with respect to the composition, the surface roughness, the density, the Vickers hardness, the number (per 100 $mm^2$ of the surface) of pools of binder metal (at least one of cobalt, nickel, and iron) having a pool size of at least 5 μm, and the average grain size. Table I shows the results.

The components other than carbon (C), such as tungsten (W), zinc (Zn), oxygen (O), cobalt (Co), nickel (Ni), and iron (Fe), were determined by ICP emission spectroscopic analysis with respect to samples of the structures of EXAMPLE 1 dissolved in an acid. The carbon (C) content of the structures of Example 1 was evaluated in an oxygen stream by a high-frequency heating combustion-infrared absorption technique.

The high-frequency combustion-infrared absorption technique in an oxygen stream was performed as follows. First, a structure of Example 1 was placed in an alumina crucible in an oxygen stream. The alumina crucible was heated so that the carbon in the structure of Example 1 reacted with the oxygen in the oxygen stream such that carbon monoxide and/or carbon dioxide were generated. Second, an atmosphere containing the carbon monoxide and/or the carbon dioxide was exposed to infrared radiation. Finally, the carbon content (% by mass) of the structure of Example 1 was measured by evaluating the attenuation of the infrared radiation due to the absorption by the carbon monoxide and/or the carbon dioxide in the atmosphere.

The surface roughness of the structures of Example 1 was evaluated with a laser microscope (Model VK-8500 from Keyence Corporation). A smaller surface roughness in Table I indicates a smoother surface. The surface roughness in Table I is an arithmetical mean roughness Ra (JIS B0601-1994).

The density of a structure of Example 1 was evaluated with a focused ion beam (FIB) apparatus by calculating the density of a rectangular specimen of 3 mm×3 mm that was cut away together with the nickel plate from around the center of the structure. The density of the structure in the specimen was determined to estimate the density of the entire structure. The density of the structure was calculated as follows. The thickness of the structure in the specimen was measured with the FIB apparatus. The area of the surface of the structure (3 mm×3 mm) was multiplied by the measured thickness to calculate the volume of the structure. The mass of the nickel plate in the specimen was calculated from the mass of the entire nickel plate previously measured. Then, the mass of the structure was calculated by subtracting the mass of the nickel plate in the specimen from the mass of the whole specimen previously measured. Finally, the density of the structure was calculated by dividing the mass of the structure by the volume of the structure.

The Vickers hardness of a structure of Example 1 was determined with a nano-indenter.

The number of pools having a pool size of at least 5 μm and consisting of at least one binder metal selected from the group consisting of cobalt, nickel, and iron on the surface of a structure of Example 1 was calculated as follows. The entire surface of the structure of Example 1 was analyzed by element mapping with an EDX, and after image processing is done so that a region containing at least 80% by mass of the binder metal can be identified, the number of regions having a pool size of at least 5 μm was counted. The number of regions thus counted was converted into the number of regions per 100 mm$^2$ of the surface of the structure of Example 1 so that the number of the pools was calculated.

The average grain size of a structure of Example 1 was determined by analyzing a dark field image of a transmission electron microscope (TEM).

The chemical shift of a peak was measured on the surface of a structure of Example 1 by electron spectroscopy for chemical analysis (ESCA). The result showed that carbon in the structure of Example 1 was contained in a state of tungsten carbide in which the carbon was chemically bonded to tungsten.

The evaluation of the structures of EXAMPLE 1 was performed using a plurality of structures prepared as described above.

Example 2

A plurality of structures of Example 2 were prepared as in Example 1 except that diethylene glycol monomethyl ether was added instead of polyethylene glycol. The structures of Example 2 were evaluated in the same manner as in Example 1 with respect to the composition, the surface roughness, the density, the Vickers hardness, the number (per 100 mm$^2$ of the surface) of pools of binder metal (at least one of cobalt, nickel, and iron) having a pool size of at least 5 μm, and the average grain size. The results are shown in Table I.

The electron spectroscopy for chemical analysis (ESCA) of the structures of Example 2 also showed that carbon in the structures of Example 2 was contained in a state of tungsten carbide.

Comparative Example 1

A plurality of structures of Comparative Example 1 were prepared as in Example 1 except that polyethylene glycol was not added. The structures of Comparative Example 1 were evaluated in the same manner as in Example 1 with respect to the composition, the surface roughness, the density, the Vickers hardness, the number (per 100 mm$^2$ of the surface) of pools of binder metal (at least one of cobalt, nickel, and iron) having a pool size of at least 5 μm, and the average grain size. Table I shows the results.

Comparative Example 2

A powder for thermal spraying containing 90% by mass of tungsten carbide (WC) and 10% by mass of cobalt was prepared by a granulation and sintering technique. By thermal-spraying the so-prepared powder using a high velocity flame spraying technique, a film (the structure of Comparative Example 2) having a thickness of 10 μm was formed on the surface of the same nickel plate as used in Example 1. The structures of Comparative Example 2 were evaluated in the same manner as in Example 1 with respect to the composition, the surface roughness, the density, the Vickers hardness, the number (per 100 mm$^2$ of the surface) of pools of binder metal (at least one of cobalt, nickel, and iron) having a pool size of at least 5 μm, and the average grain size. Table I shows the results. A plurality of structures were prepared in Comparative Example 2.

TABLE I

| | Composition (% by mass) | | | | | | | | Surface roughness (μm) | Density (g/cm$^3$) | Vickers hardness (Hv) | Number of pools (—) | Average grain size (nm) |
| --- | --- | --- | --- | --- | --- | --- | --- | --- | --- | --- | --- | --- | --- |
| | W | Zn | O | C | Ni | Co | Fe | Others | | | | | |
| Example 1 | 95.1 | 0.1 | 3.0 | 0.8 | 0.0 | 0.0 | 0.0 | 1.0 | 0.4 | 17.0 | 1020 | 0 | 12 |
| Example 2 | 94.8 | 0.6 | 2.0 | 1.1 | 0.0 | 0.0 | 0.0 | 1.5 | 0.6 | 16.9 | 1100 | 0 | 9 |
| Comparative Example 1 | 95.0 | 0.2 | 3.0 | 0.0 | 0.0 | 0.0 | 0.0 | 1.8 | 0.8 | 17.9 | 700 | 0 | 23 |
| Comparative Example 2 | 80.9 | 0.0 | 2.1 | 5.3 | 0.6 | 9.6 | 0.2 | 1.3 | 6.5 | 12.3 | 920 | 26 | 250 |

Table I shows that the surfaces of the structures of Examples 1 and 2 are smoother than the surfaces of the structures of Comparative Example 1 and 2. The Vickers hardnesses of the structures of Examples 1 and 2 are larger than those of the structures of Comparative Examples 1 and 2.

Example 3

A titanium layer having a thickness of 0.3 μm was formed by titanium sputtering on the surface of a discoidal silicon substrate having a diameter of 3 inches. A PMMA photoresist having a width of 1 cm, a length of 1 cm, and a thickness of 30 μm was applied to the titanium layer. Then, a part of the photoresist was irradiated with synchrotron radiation (SR) so that the photoresist of the irradiated part was selectively removed. Thus, a striped resist pattern with line/space of 50 μm/50 μm was formed on the titanium layer.

Then, in a glove box in an Ar atmosphere, a cathode of the silicon substrate on which the resist pattern was formed and an anode of a tungsten rod were dipped in a molten salt bath of 1000 g prepared in the same manner as in Example 1. Then, galvanostatic electrolysis was performed by applying 3 mA electric current per 1 cm$^2$ of the titanium layer on the silicon substrate (electric current density: 3 mA/cm$^2$) between the electrodes for 60 hours while the molten salt was maintained at 250° C. Thus, a structure of Example 3 was deposited on the titanium layer.

After the galvanostatic electrolysis, the silicon substrate was removed from the glove box. The silicon substrate was washed with water to remove salts on the silicon substrate. Then, after the silicon substrate was dried, plasma ashing was performed with a gas mixture of $CF_4$ (carbon tetrafluoride) and $O_2$ (oxygen) to remove the photoresist on the titanium layer. Finally, the structure of Example 3 on the titanium layer was mechanically detached from the titanium layer, and consequently the structure of Example 3 having a shape on the order of micrometers was obtained. The composition of the structure of Example 3 was evaluated as in Example 1. The result of the evaluation was the same as that of the structure of Example 1 described in Table I.

It is to be understood that the embodiments and Examples described above are illustrated by way of Example and not by way of limitation in all respects. The scope of the present invention is defined by the appended claims rather than by the description preceding them. All changes that fall within the scope of the claims and the equivalence thereof are therefore intended to be embraced by the claims.

INDUSTRIAL APPLICABILITY

The present invention is suitable for application in the manufacture of a mechanical part, a film coated on a mechanical part, and the like.

The invention claimed is:

1. A method of manufacturing a structure comprising tungsten as a main component and tungsten carbide, the method comprising the step of:
   forming the structure by electro-deposition of a molten salt containing at least two elements selected from the group consisting of lithium, sodium, potassium, rubidium, cesium, beryllium, magnesium, calcium, strontium, and barium; at least one element selected from the group consisting of fluorine, chlorine, bromine, and iodine; tungsten; zinc; and an organic compound,
   wherein the content of carbon in the structure is at least 0.1% by mass and the total content of cobalt, nickel, and iron is 3% or less by mass, respectively based on the structure.

2. The method of manufacturing the structure according to claim 1, wherein the electro-deposition is conducted at a temperature of the molten salt of 300° C. or less.

3. The method of manufacturing the structure according to claim 1, wherein the organic compound is polyethylene glycol.

* * * * *